United States Patent
Wuidart

(10) Patent No.: US 8,045,381 B2
(45) Date of Patent: Oct. 25, 2011

(54) DEVICE FOR PROTECTING A MEMORY AGAINST ATTACKS BY ERROR INJECTION

(75) Inventor: Sylvie Wuidart, Pourrieres (FR)

(73) Assignee: STMicroelectronics SA, Montrouge (FR)

( * ) Notice: Subject to any disclaimer, the term of this patent is extended or adjusted under 35 U.S.C. 154(b) by 111 days.

(21) Appl. No.: 11/920,176

(22) PCT Filed: Mar. 31, 2006

(86) PCT No.: PCT/FR2006/000704
§ 371 (c)(1),
(2), (4) Date: Nov. 8, 2007

(87) PCT Pub. No.: WO2006/120310
PCT Pub. Date: Nov. 16, 2006

(65) Prior Publication Data
US 2009/0073759 A1    Mar. 19, 2009

(30) Foreign Application Priority Data
May 9, 2005    (FR) ...................... 05 04610

(51) Int. Cl.
*G11C 11/34* (2006.01)
*G11C 7/00* (2006.01)
(52) U.S. Cl. .......... 365/185.09; 365/185.2; 365/185.21; 365/185.22; 365/185.33; 365/189.07

(58) Field of Classification Search ............. 365/185.09, 365/185.2, 185.21, 185.22, 185.33, 184.33, 365/189.07; 345/502
See application file for complete search history.

(56) References Cited

U.S. PATENT DOCUMENTS

| | | | | |
|---|---|---|---|---|
| 5,315,700 A * | 5/1994 | Johnston et al. | ............... | 345/502 |
| 5,652,720 A * | 7/1997 | Aulas et al. | ............... | 365/185.09 |
| 6,160,734 A | 12/2000 | Henderson et al. | ...... | 365/185.04 |
| 6,661,708 B2 * | 12/2003 | Cernea et al. | ............... | 365/185.2 |
| 7,218,553 B2 * | 5/2007 | Devin | ........................ | 365/185.2 |
| 7,283,397 B2 * | 10/2007 | Harari et al. | ............... | 365/185.2 |
| 7,397,702 B2 * | 7/2008 | Rolandi et al. | ............. | 365/185.2 |
| 2004/0052110 A1 | 3/2004 | Nguyen et al. | ........... | 365/185.04 |

FOREIGN PATENT DOCUMENTS

| EP | 1 150 300 A2 | 10/2001 |
|---|---|---|
| WO | WO 00/72117 | 11/2000 |

* cited by examiner

*Primary Examiner* — Trong Phan
(74) *Attorney, Agent, or Firm* — Lisa K. Jorgenson; E. Russell Tarleton; Seed IP Law Group PLLC

(57) ABSTRACT

A memory is secured against an error injection during the reading of a datum. The memory includes: means for reading a reference datum in the memory during a phase of reading a datum stored in the memory; means for comparing the reference datum read with an expected value; and means for generating an error signal if the datum read is different from the expected value. Application is provided particularly but not exclusively to the protection of memories integrated into smart cards.

17 Claims, 4 Drawing Sheets

DEVICE FOR PROTECTING A MEMORY AGAINST ATTACKS BY ERROR INJECTION

TECHNICAL FIELD

The present disclosure generally relates to the protection of integrated circuits against attacks by error injection, and particularly but not exclusively to the protection of integrated circuits present in integrated circuit cards such as smart cards.

The present disclosure relates more particularly but not exclusively to a method for securing the reading of a memory.

It applies in particular, but not exclusively, to non-volatile memories such as ROM, EEPROM and FLASH memories.

BACKGROUND INFORMATION

In recent years, the techniques of hacking secured microprocessor integrated circuits (microprocessors, microcontrollers, microprocessor memories, coprocessor integrated circuits, etc.) have developed considerably. The most advanced hacking methods currently involve injecting errors at determined points of an integrated circuit during the execution of so-called sensitive operations, such as authentication operations or operations of executing a cryptography algorithm for example. Such attacks by error injection also referred to as attacks by fault injection enable, in combination with mathematical models, the structure of a hard-wired logic cryptography algorithm and/or the secret keys it uses to be deduced. The error injection can be done in various ways, by introducing glitches into the supply voltage of the integrated circuit, by introducing glitches into the clock signal of the integrated circuit, by exposing the integrated circuit to radiations or to a laser beam, etc.

One known method disclosed in U.S. Patent Application Publication No. US 2004/052110 involves conducting integrity checks on the content of the memory, when starting the integrated circuit or during the course of its operation for example. However, these checks do not detect attacks that do not change the content of the memory, but which aim to change the data at the moment they are read in the memory, i.e., on the memory read path.

BRIEF SUMMARY

An embodiment of the present invention aims to protect a memory against attacks aimed at changing a datum during the reading cycle. This is achieved by providing, every time the memory is read, a second read of a reference datum the integrity of which is checked.

More particularly, one embodiment of the present invention provides a method of reading of a datum in a memory, comprising a reading cycle of a datum in the memory triggered following the reception by the memory of a reading order and comprising a reading of the datum in the memory. According to one embodiment of the present invention, the reading cycle of a datum in the memory further comprises:

reading a reference datum stored in the memory,
comparing the reference datum read with an expected value, and
putting the memory into an error mode if the datum read is different to the expected value.

According to one embodiment of the present invention, the reference datum is read immediately after the reading of the datum to be read in the memory.

According to one embodiment of the present invention, the reference datum is read during a clock cycle following the reading of the datum to be read in the memory.

According to one embodiment of the present invention, the reference datum is read during a same clock cycle as the reading of the datum to be read in the memory.

According to one embodiment of the present invention, the memory comprises memory cells connected to word lines arranged in rows, and to bit lines arranged in columns of bits, the word lines being connected to a row decoder, the bit lines being linked to sense amplifiers, the phase of reading a datum in the memory comprising:

selecting a word line corresponding to a received address of the datum to be read,
reading memory cells of the selected word line,
applying the content of the memory cells read to an output data bus of the memory,
selecting a reference word line corresponding to the address of the reference datum,
reading reference memory cells of the selected reference word line where the reference datum is read,
comparing the reference datum read with an expected value, and
putting the memory into an error mode if the reference datum read is different from the expected value.

According to one embodiment of the present invention, the memory sends an error signal in error mode.

An embodiment of the present invention also relates to a read-secured memory comprising means for reading a datum in the memory during a reading cycle, subsequent to a read command of the datum, received by the memory. According to one embodiment of the present invention, the memory comprises:

means for reading a reference datum in the memory, during the reading cycle subsequent to the read command of the datum,
means for comparing the reference datum read with an expected value, and
means for generating an error signal if the datum read is different to the expected value.

According to one embodiment of the present invention, the memory comprises means for reading a datum and the reference datum during a same clock cycle.

According to one embodiment of the present invention, the memory comprises means for reading a datum and the reference datum during two successive clock cycles.

According to one embodiment of the present invention, the memory comprises:

memory cells connected to word lines arranged in rows and to bit lines arranged in columns of bits,
a row decoder connected to the word lines for selecting a word line corresponding to a received address of the datum to be read,
means for selecting, during of the reading cycle of a word in the memory, a reference word line to which reference memory cells containing the reference datum are connected, and for triggering the reading of the selected memory cells, and
means for comparing the content of the reference memory cells read with respective expected values, the error signal being sent on an error signal output if the content of a memory cell of the reference word line is different to a respective expected value.

According to one embodiment of the present invention, the memory cells are disposed in a memory array, the reference word line being located on one edge of the memory array opposite links between the bit lines and sense amplifiers.

According to one embodiment of the present invention, the memory comprises a column decoder for selecting a group of bit lines forming a word corresponding to the received address of the datum to be read, the memory cells of the reference word line in which the reference datum is stored saving the reference datum in each group of bit lines.

BRIEF DESCRIPTION OF THE SEVERAL
VIEWS OF THE DRAWINGS

These and other features of one or more embodiments of the present invention will be explained in greater detail in the following description given in relation with, but not limited to, the following figures.

DETAILED DESCRIPTION

Embodiments of a device for protecting a memory against attacks by error injection are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
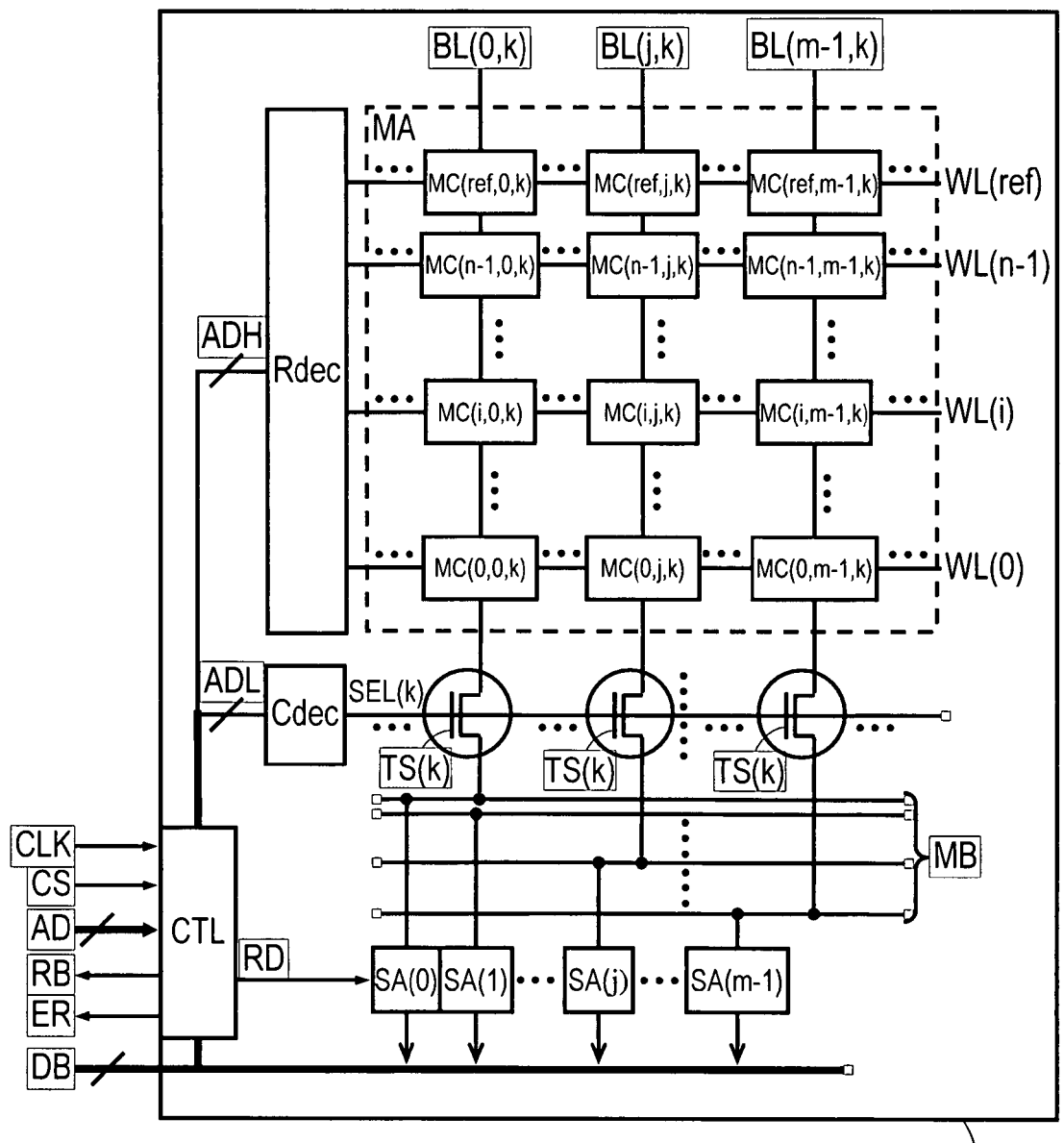
FIG. 1 represents in a diagram the architecture of a memory according to one embodiment of the present invention.

FIG. 1 represents a memory 1 comprising a memory array MA, a word line decoder RDEC, a column decoder CDEC, and a control circuit CTL. The memory array MA comprises memory cells MC(i,j,k), MC(ref,0,k), MC(ref, m−1,k), MC(n−1,0,k), MC(n−1, j,k), MC(n−1,0,k), MC(n−1,m−1,k), MC(i,0,k), MC(i,m−1,k), MC(0,0,k), MC(0,j,k), MC(0,m−1, k) connected to word lines WL(i) disposed in rows, and to bit lines BL(j,k), BL(0,k) and BL(m−1, k) disposed in columns. The word lines WL(i), WL(ref), WL(n−1), and WL(0) are controlled by the row decoder RDEC. Each bit line BL(j,k) is linked to a sense amplifier SA(j) (j being a whole number between 0 and m−1) through a k-rank word column selection transistor TS(k), and a multiplexing bus MB.

The selection transistors TS(k) are driven by a signal SEL (k) sent by the column decoder CDEC. The sense amplifiers SA(j) that are connected at input to the multiplexing bus MB and at output to an output bus DB of the memory, enable m bits of a word selected in a word line WL(i) to be read, and the values of these bits to be applied on a respective line of the bus DB.

The control circuit CTL receives a read address AD at input, as well as clock CLK and chip select CS signals enabling the memory to be activated, and delivers at output a signal RD for triggering the sense amplifiers, and addresses ADH and ADL that are respectively applied to the row decoder RDEC and to the column decoder CDEC. Typically, the address ADH applied to the row decoder groups together the most significant bits of the address AD applied at input of the memory, and the address ADL applied to the column decoder groups together the least significant bits. Using the addresses ADH and ADL, the row and column decoders select a word line of rank i and a word column of rank k grouping together several bit lines BL(j,k). The control circuit issues at output of the memory a signal RB (Ready/Busy) which indicates to the external circuits whether the memory is busy or ready to receive another read command.

According to one embodiment of the present invention, a group of memory cells MC(ref,j,k) connected to a word line WL(ref) of the memory array MA is reserved for storing a reference word that is read at each phase of reading a word in the memory. The control circuit CTL is designed to retrieve the reference word read and to compare it with an expected value saved by the control circuit. If the reference word read does not have the expected value, the control circuit puts the memory into error mode, by sending an error signal on an output ER of the memory provided for that purpose for example.

Figure 2:
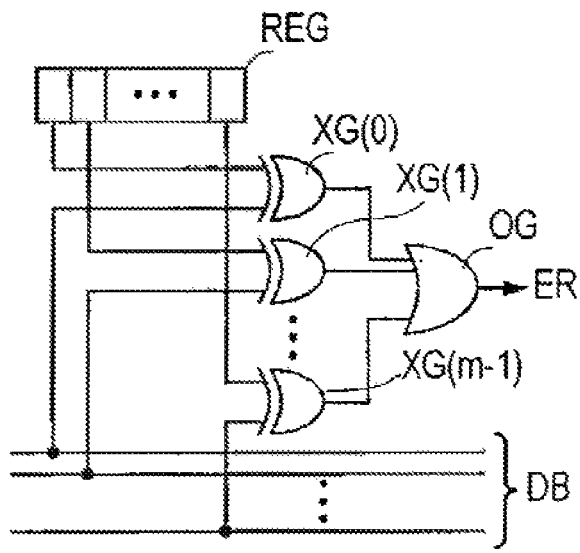
FIG. 2 represents one embodiment of a circuit of the memory represented in FIG. 1.

FIG. 2 represents an example of an embodiment of a comparison circuit enabling a bit by bit comparison to be performed between the reference word read, appearing on the data bus DB, and a reference value for example which is saved in a register REG internal to the control circuit CTL. The comparison circuit is designed to produce a signal on 1 at an output ER if a difference on at least one bit is detected between the reference word read and the expected value of this reference word. To this end, the comparison circuit comprises a set of exclusive OR gates XG(m−1), XG(j) (j being a whole number between 0 and m−1). Each gate XG(j) comprises a first input connected to a respective cell of the register REG and a second input connected to a respective corresponding line of the bus DB. The output of each of the gates XG(j) is connected to a respective input of an OR gate OG the output of which is connected to the output ER of the comparison circuit. If all of the bits in the register containing the reference value are identical to the respective bits of the reference word read in the word line WL(ref) appearing on the bus DB, the outputs of the gates XG(j) are on 0. The output ER of the OR gate OG is also on 0. However, if at least one of the bits in the register REG is different to the bit read on the corresponding line of the data bus DB, the corresponding gate XG(j) issues a signal on 1, and the output ER of the OR gate OG changes to 1.

In one embodiment, the word line WL(ref) chosen for storing the reference word is situated in the memory array MA opposite the point at which the sense amplifiers SA(j) are connected to the bit lines BL(j,k). In this way, irrespective of the area of the read path to which the glitch is applied, the reference datum read will also undergo the glitch and will therefore be different to the expected value.

Figure 3A:
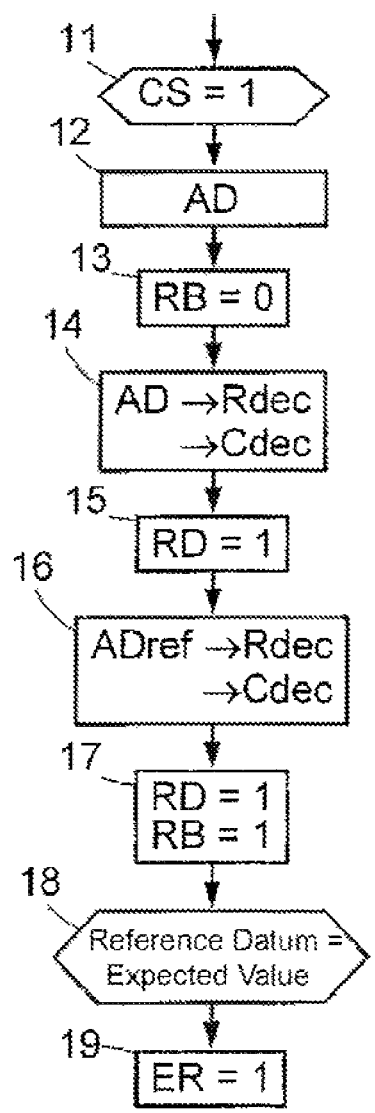
FIGS. 3A and 3B are flow charts showing the method according to one embodiment of the present invention.
Figure 3B:
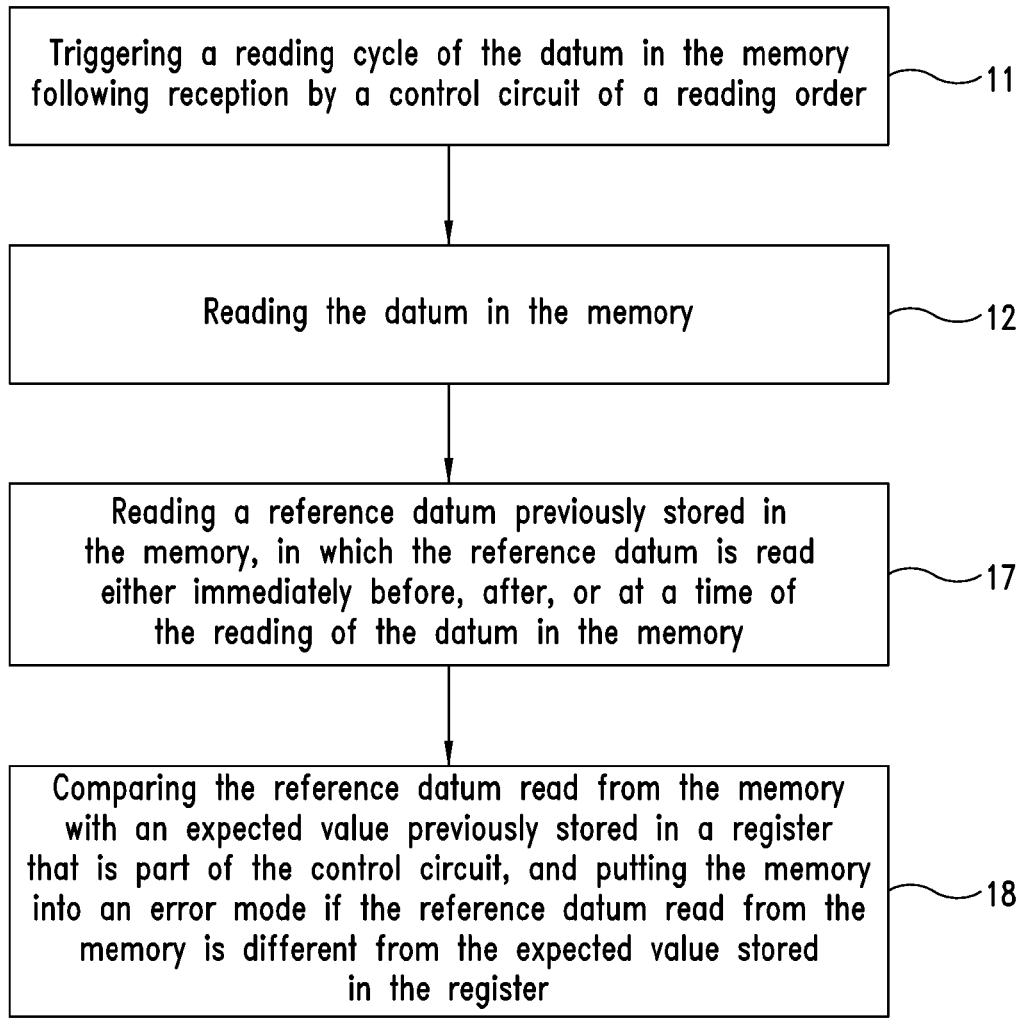

FIGS. 3A and 3B show a method according to the present disclosure implemented in the control circuit CTL. The method is activated when the signal CS applied to the memory changes to 1 (step 11). The sending of this signal triggers a phase of reading a datum in the memory at the address supplied on the address input bus AD of the memory (step 12). Simultaneously, the control circuit puts the memory to the busy state by sending the signal RB (step 13).

In the next step 14, the control circuit sends the addresses ADH and ADL corresponding to the address received on the address bus AD to the row Rdec and column Cdec decoders, which results in selecting the memory cells MC(i,j,k) belonging to a word line WL(i) and to the group of bit lines BL(j,k) of a k-rank word column.

In the next step 15, the control circuit sends a signal RD for triggering the reading which is applied to the sense amplifiers SA(j). The word read is then applied on the data bus DB by the sense amplifiers SA(j). Following the reading of a word in the memory, the control circuit sends the row decoder Rdec and column decoder Cdec the address of the reference word ADref stored by the memory (step 16).

The rank-k word column selected to access the reference word is the one that was selected in step 14 to be able to detect a glitch irrespective of the bit line BL(j,k) of the datum read path to which it has been applied. In this case, all of the words stored in the memory cells of the reference word line WL(ref) are identical and have the value stored in the register REG.

In the next step 17, the read trigger signal RD is sent again. The sense amplifiers then apply the reference datum read on the data bus. In the next step 18, the control circuit compares the reference word read with the reference value saved in the register REG to determine if Reference Datum=Expected Value, and if a difference is detected, the control circuit CTL puts the signal applied on the error signal output ER to 1.

Figure 4A:
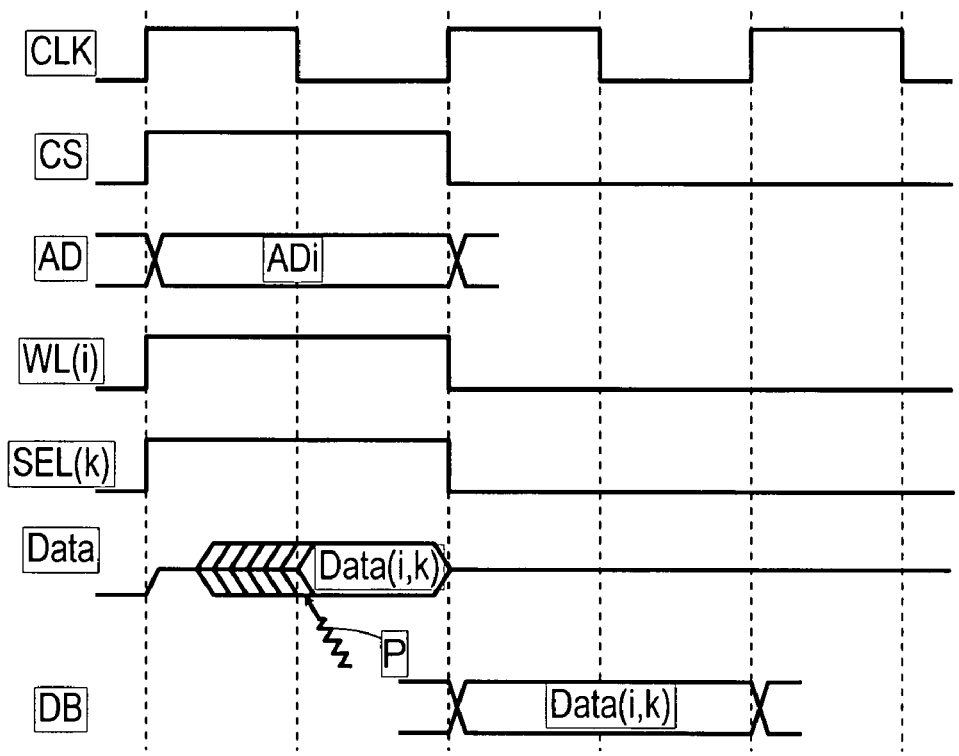
FIG. 4A is a timing diagram showing an example cycle of reading a classical memory.

FIG. 4A shows, in the form of timing diagrams, a classical sequence of reading a word situated on the word line WL(i) and in the k-rank word column of the memory. This FIG. 4A shows the clock signal CLK, the signal CS for activating the memory, the address signals AD, the word line selection signal WL(i), the k-rank word column selection signal SEL (k), the signal Data of the datum read at output of the sense amplifiers SA(j), and the data signal on the bus DB.

During a clock cycle CLK, the signal CS for activating the memory is on 1, whereas the read address ADi is present on the bus AD. The read address is processed by the row RDEC and column CDEC decoders to determine which signals WL(i) and SEL(k) for selecting the word line and column are to be changed to 1 during the same clock cycle. As soon as the signals WL(i) and SEL(k) change to 1, the corresponding memory cells are read by the sense amplifiers SA(j). Upon the next clock cycle, the datum read Data(i,k) is sent to the data bus DB. If a glitch P is applied to the read path, i.e., to the bit lines BL(j,k) or to the sense amplifiers, the datum Data(i,k) sent to the data bus DB is false.

Figure 4B:
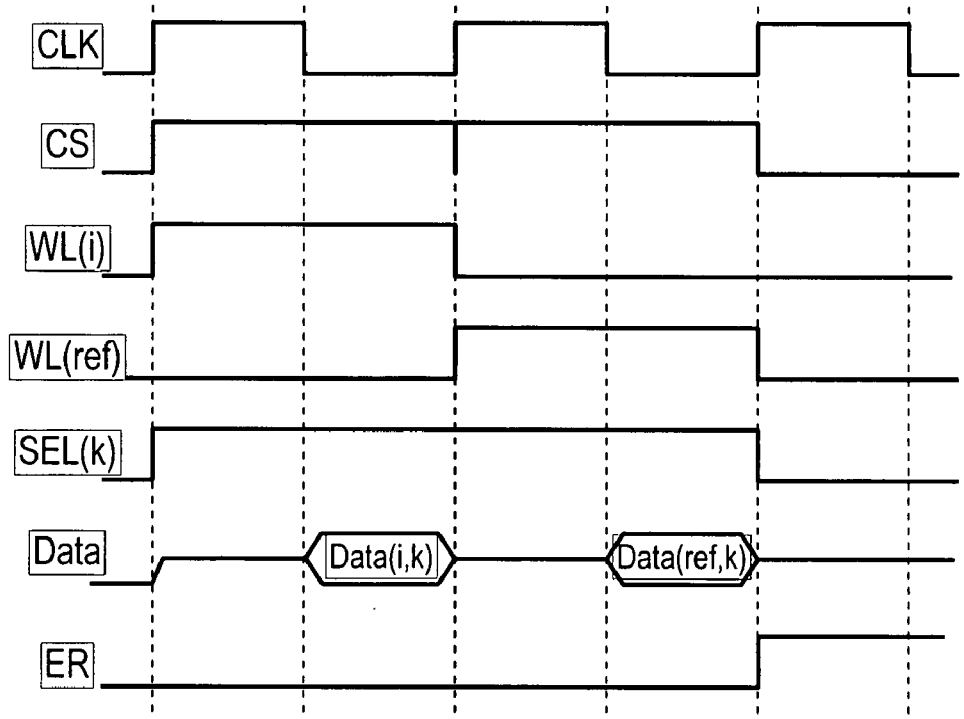
FIG. 4B is a timing diagram showing an example cycle of reading the memory according to one embodiment of the present invention.

To detect such a glitch, the signals CS for selecting the memory and SEL(k) for selecting a k-rank word column are maintained on 1 for two clock cycles, as shown in FIG. 4B. As in the classical read procedure (FIG. 4A), the signal WL(i) for selecting the word line to be read is positioned on 1 during the first clock cycle. During the second clock cycle, the signal WL(ref) for reading the reference word line is put to 1, to read the reference word Data(ref,k) stored in the memory cells of the line WL(ref) and of the k-rank word column (signal SEL (k) on 1). The result is that at output of the sense amplifiers SA(j), the datum Data(i,k) appears at the end of the first clock cycle, and the reference datum Data(ref,k) read in the reference word line appears at the end of the second clock cycle. If the value read of the reference datum is different to the expected value, the error signal applied on the output ER changes to 1.

Advantageously, the control circuit CTL reads the datum to be read and reads the reference datum in a single cycle of the clock signal CLK applied to the memory 1. To this end, the control circuit generates, using the clock signal CLK, an internal clock signal for sequencing the read operations the frequency of which is equal to two times that of the clock signal CLK.

Various alternatives of the method according to embodiments of the present invention are possible, particularly as far as processing the error signal is concerned. In particular, it is not necessary for the error to be indicated to the environment outside the memory. Any appropriate measure can thus be taken, such as erasing sensitive data from the memory. If the error is indicated to the outside environment, any appropriate measure can be taken, such as initializing the processing unit that accesses the memory, or completely taking the integrated circuit that incorporates the memory according to one embodiment of the present invention out of service.

Furthermore, the reference datum can also be read before the datum corresponding to the address applied on the address bus of the memory is read.

Moreover, embodiments of the present invention can be applied to any type of memory in which the memory cells are arranged in rows and columns, and in which a read is performed by selecting a row and by reading one or simultaneously several memory cells of the selected row. Obviously, the notions of row and column can be reversed.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible and can be made without deviating from the spirit and scope of the invention.

These and other modifications can be made in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A method of securing against error injection during reading of a datum in a memory that includes memory cells coupled to word lines arranged in rows, and to bit lines arranged in columns of bits, the word lines coupled to a row decoder, the bit lines linked to sense amplifiers, the method comprising:
   triggering a reading cycle of the datum in the memory following reception by a control circuit of a reading order; and
   reading the datum in the memory,
   reading a reference datum previously stored in the memory, wherein the reference datum is read either immediately before, after, or at a time of the reading of the datum in the memory,
   comparing the reference datum read from the memory with an expected value previously stored in a register that is part of the control circuit, and
   putting the memory into an error mode if the reference datum read from the memory is different from the expected value stored in the register.

2. The method according to claim 1 wherein the reference datum is read during a clock cycle following the reading of the datum in the memory.

3. The method according to claim 1 wherein the reference datum is read during a same clock cycle of the memory as the reading of the datum stored in the memory is read by using an internal clock signal that is equal to two times that of a clock cycle for the memory.

4. The method according to claim 1 wherein the datum in the memory is read by selecting a word line and a word column, and the reference datum is read at a same voltage value as a voltage value used to read the datum stored in the memory by selecting the word column and a reference word line.

5. The method according to claim 1 wherein the memory sends an error signal in the error mode.

6. A memory structured for securing against error injection of a datum in a memory during a reading of the datum stored in the memory during a read cycle, subsequent to a read command of the datum, the memory comprising:
 a circuit coupled to the memory structured to read the reference datum at a same read voltage as the read voltage of the datum in the memory, the reference datum previously stored in a reserved reference word line of the memory, the circuit structured to read the reference datum during the read cycle that is subsequent to the read command of the datum in the memory;
 a storage device apart from the memory that is structured to hold a previously stored expected value having a same value as a value of the reference datum;
 a circuit coupled to the read circuit that is structured to compare the reference datum read with the expected value; and
 a circuit coupled to the compare circuit that is structured to generate an error signal if the reference datum read is different from the expected value.

7. The memory according to claim 6 wherein said read circuit is configured to read the datum in the memory and the reference datum during a same clock cycle, the read circuit comprising an internal clock signal generator structured to generate an internal clock signal that is two times as fast as a memory clock signal used in the memory.

8. The memory according to claim 6 wherein said read circuit is configured to read the datum in the memory and the reference datum during two successive clock cycles.

9. The memory according to claim 6 wherein the datum in the memory is read by selecting a word line and a word column, and the reference datum is read by selecting the word column and a reference word line.

10. The memory according to claim 6, further comprising:
 memory cells coupled to word lines arranged in rows and to bit lines arranged in columns of bits;
 a row decoder coupled to the word lines and structured to select a word line corresponding to a received address of the datum in the memory to be read;
 a selection circuit that is structured to select, during the reading cycle of a word in the memory, a reference word line to which reference memory cells containing the reference datum are coupled, and that is structured to trigger a reading of the selected reference memory cells; and
 a comparison circuit coupled to the selection circuit and structured to compare the reference datum read from the reference memory cells with a respective expected value, the error signal sent on an error signal output if the reference datum of a memory cell of the reference word line is different from the respective expected value.

11. The memory according to claim 10 wherein the selection circuit comprises a column decoder coupled to the bit lines to select a group of bit lines forming the word corresponding to the received address of the datum in the memory to be read, and the memory cells of the reference word line in which the reference datum is stored are configured to save the reference datum in the group of bit lines.

12. An apparatus, comprising:
 a memory array having a reference word line reserved for a reference datum;
 a first circuit block coupled to the memory array and structured to read the reference datum from the reserved reference word line in the memory array during a reading of a datum in the memory array to be read;
 a second circuit block coupled to the first circuit block and structured to compare the reference datum read with an expected value previously stored in a register that is not part of the memory array, the expected value having a same value as a value of the reference datum; and
 a third circuit block coupled to the second circuit block and structured to generate an error signal if the value of the reference datum read is different from the expected value.

13. The apparatus of claim 12 wherein the first circuit block is structured to read the reference datum and the datum in the memory to be read during a same clock cycle, the first circuit block comprising an internal clock signal generator that is structured to generate an internal clock signal that is two times as fast as a memory clock signal used in the memory.

14. The apparatus of claim 12 wherein the first circuit block is structured to read the datum in the memory to be read and the reference datum during successive clock cycles.

15. The apparatus of claim 12, further comprising:
 memory cells in the memory array coupled to word lines arranged in rows and to bit lines arranged in columns of bits;
 a row decoder coupled to the word lines and structured to select a word line corresponding to a received address of the datum in the memory to be read;
 a selection circuit coupled to the row decoder and structured to select, during a phase of reading the memory array, a word line to which memory cells containing the reference datum are connected, and to trigger reading of the selected memory cells at a same read voltage; and
 a comparison circuit included with the second circuit and coupled to the memory cells, the comparison circuit structured to compare reference datum in each of the memory cells read with respective previously stored expected values that are the same as respective values of the reference datum, the error signal sent on an error signal output if the reference datum value of a memory cell of a reference word line is different from a respective expected value.

16. The apparatus of claim 15, further comprising a column decoder coupled to the bit lines and structured to select a group of bit lines forming a word corresponding to the received address of the datum in the memory to be read, the memory cells of the word line in which the reference datum is stored saving the reference datum in each group of bit lines.

17. The apparatus of claim 12 wherein the memory array comprises part of a ROM, EEPROM, or FLASH memory.

* * * * *